US007939439B2

(12) United States Patent
Kim

(10) Patent No.: US 7,939,439 B2
(45) Date of Patent: May 10, 2011

(54) SEMICONDUCTOR DEVICE AND FABRICATING METHOD THEREOF

(75) Inventor: Nam Joo Kim, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/626,833

(22) Filed: Nov. 27, 2009

(65) Prior Publication Data

US 2010/0140739 A1   Jun. 10, 2010

(30) Foreign Application Priority Data

Dec. 4, 2008  (KR) .................. 10-2008-0122793

(51) Int. Cl.
*H01L 21/265* (2006.01)
(52) U.S. Cl. ................. 438/523; 257/E21.022

(58) Field of Classification Search .............. 438/381, 438/514, 522, 523; 257/277, 532, E21.022
See application file for complete search history.

(56) References Cited

U.S. PATENT DOCUMENTS 6,859,129 B2 *  2/2005  Tsai et al. ............ 336/200
* cited by examiner

*Primary Examiner* — Quoc D Hoang
(74) *Attorney, Agent, or Firm* — The Law Offices of Andrew D. Fortney; Andrew D. Fortney

(57) ABSTRACT

Disclosed is a semiconductor device which includes a substrate having an air layer or void therein, an interlayer dielectric film above the substrate, and a metal wiring having a spiral structure on the interlayer dielectric film corresponding to or over the air layer. The semiconductor device exhibits reduced parasitic capacitance between the metal wiring (used as an inductor) and the substrate, thereby improving a self-resonance frequency as well as an applicable frequency band of the inductor.

13 Claims, 4 Drawing Sheets

SEMICONDUCTOR DEVICE AND FABRICATING METHOD THEREOF

This application claims the benefit of Korean Patent Application No. 10-2008-0122793, filed on Dec. 4, 2008, which is hereby incorporated by reference as if fully set forth herein.

BACKGROUND OF THE INVENTION

1. Field of the Invention

Exemplary embodiments of the present invention relate to a semiconductor device and a method for fabrication thereof.

2. Discussion of the Related Art

With development of micro-processing technologies, complementary metal-oxide semiconductor ("CMOS") technologies with improved frequency characteristics have been proposed. Applying semiconductor processing techniques makes fabrication of chips economically feasible. In particular, since immediate frequency ("IF") circuits and digital circuits can also be integrated into a chip, a System on Chip ("SOC") process is increasingly attracting attention as an appropriate technology for fabrication of single chips in the related art.

An RF-CMOS or bipolar/BiCMOS device includes an RF MOSFET, an inductor, a varactor, a metal-insulator-metal (MIM) capacitor and a resistor as major components. Here, the inductor is a single device occupying the greatest space in a chip and may be limited with regard to high frequency characteristics due to parasitic capacitance and resistance caused by an internal structure and/or constructional material thereof.

FIG. 1 is a top view illustrating a structure of an inductor 10; and FIG. 2 is a lateral cross-sectional view illustrating the inductor 10 taken along lines a-a' shown in FIG. 1.

Referring to FIGS. 1 and 2, the inductor 10 includes a substrate 11, an interlayer oxide film 12 formed above the substrate 11, a metal part 13 placed on the interlayer oxide film 12, and a top protective film 14 enclosing the metal part 13 laminated on the interlayer oxide film 12. The metal part 13 constitutes an inductor line and has a spiral structure.

As such, the inductor 10 with a spiral structure may encounter a problem of reduced self-resonance frequency caused by parasitic capacitance generated between two metal parts 13 (d1) and/or between the metal part 13 and the substrate 11 (d2). When a frequency of a signal applied to the inductor increases, a cross-point (or an intersection) may be present at a position where inductance and capacitance are switched from each other and such a cross-point is referred to as "self-resonance frequency."

For the spiral form inductor 10, when the inductance rises, the device structure is enlarged and a parasitic capacitance of the inductor is increased which in turn decreases the self-resonance frequency. Accordingly, an applicable frequency band of the inductor 10 may be reduced.

SUMMARY OF THE INVENTION

Accordingly, exemplary embodiments of the present invention are directed to solving the above conventional problem, and provide an inductor capable of reducing parasitic capacitance between a metal part used as an inductor line and a substrate, and a method for manufacturing the same.

According to an exemplary embodiment of the present invention, there is provided a semiconductor device which includes a substrate having an air layer (or void) therein, a dielectric film above the substrate, and a metal wiring on the dielectric film, over or corresponding to the air layer or void.

According to another exemplary embodiment of the present invention, there is also provided a method for fabricating a semiconductor device, including forming an ion implantation region in a substrate; heating the substrate to change the ion implantation region into a sacrificial layer; forming a plurality of trenches in the substrate to expose the sacrificial layer; removing the sacrificial film exposed by or through the trenches to generate a space or void inside the substrate; oxidizing the substrate to form an oxide film along an inner wall of the space or void; and forming a metal wiring on the oxide film.

The semiconductor device according to exemplary embodiments of the present invention has a substrate with a space or void generated therein, plural trenches in the substrate in communication with the space or void, an oxide film along an inner wall of the space or void and as an internal space or sidewall of each trench, a dielectric film covering the trenches, and an inductor on the dielectric film, corresponding to or over an air layer (i.e., the space or void) in the substrate.

The method for fabricating a semiconductor device according to exemplary embodiments of the present invention includes selectively implanting oxygen ions into a substrate to form an ion implantation region a predetermined distance below a surface of the substrate; heating the substrate to change the ion implantation region into a silicon oxide film or layer; forming a plurality of trenches in the substrate to partially expose the silicon oxide film or layer; removing the silicon oxide film or layer exposed by or through the trenches to generate a space or void inside the substrate; oxidizing the substrate to form an oxide film along a lateral wall of each trench; and forming an inductor line on an uppermost surface of the substrate. Multiple ion implantation regions can be formed at a constant interval from each other.

As is apparent from the above disclosure, the semiconductor device according to exemplary embodiments of the present invention exhibits reduced parasitic capacitance between an inductor and the substrate, thus considerably increasing the self-resonance frequency as well as the applicable frequency band of the inductor.

In addition, owing to reduced parasitic capacitance, performance of the inductor at a specific frequency band may be enhanced, thereby favorably providing or embodying the inductor with a high Q factor and improving quality of an inductor used at a specific frequency band.

It is to be understood that both the foregoing general description and the following detailed description of the present invention are exemplary and explanatory and are intended to concretely describe the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Hereinafter, a semiconductor device and a process for manufacturing the same will be described in detail from the following description with reference to exemplary embodiments, taken in conjunction with the accompanying drawings. Hereinafter, "first," "second," etc. are used to distinguish individual components without restriction thereof and mean that at least two components are provided. Accordingly, if "first," "second," etc. are mentioned, it is clearly understood that a plurality of components are provided in the foregoing semiconductor device and respective components are selectively used or mutually exchangeable. In addition, a size (dimension) of each component shown in the figures is enlarged for more detailed understanding of the invention and a ratio of sizes between components shown in the figures may be different from a ratio of actual sizes between the same components. All of the components shown in the figures need not either be included in the present invention or restricted. That is, some components (excluding components essential for one or more technical configurations of the invention) may be added or deleted from the invention. With respect to description of the exemplary embodiments of the present invention, when each layer(film), region, pad, pattern or structural component is formed "on/above/over/upper" or "down/below/under/lower" a substrate or another layer(film), region, pad, pattern or structural component, this is construed such that a layer(film), region, pad, pattern or structural component directly comes into contact with another layer(film), region, pad, pattern or structural component or, otherwise, includes additional layers(films), regions, pads, patterns or structural components interposed therebetween. Accordingly, the foregoing meanings are duly determined in view of technical spirits of the present invention.

FIGS. 3 to 9 are cross-sectional views illustrating a semiconductor device according to one or more exemplary embodiments of the present invention.

According to exemplary embodiments of the present invention, an inductor may be embodied in a chip together with a semiconductor device. Examples of such a semiconductor device include a CMOS device, an NMOS device, a PMOS device, and the like.

Figure 1:
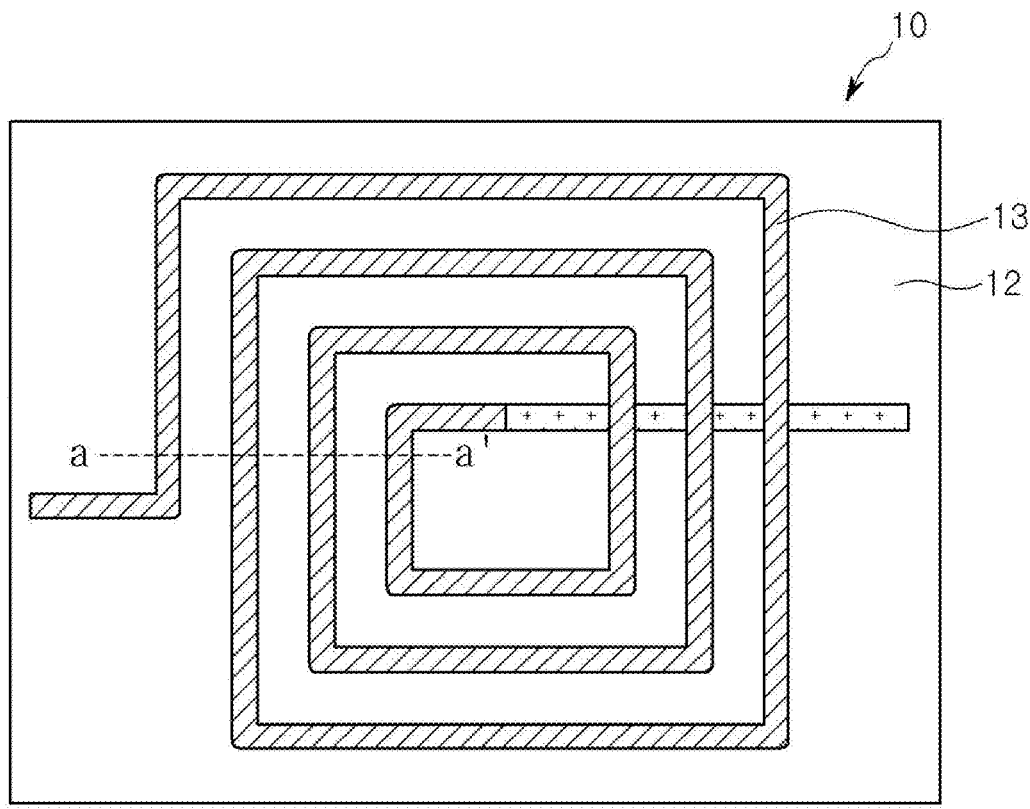
FIG. 1 is a top view illustrating a structure of an inductor.
Figure 2:
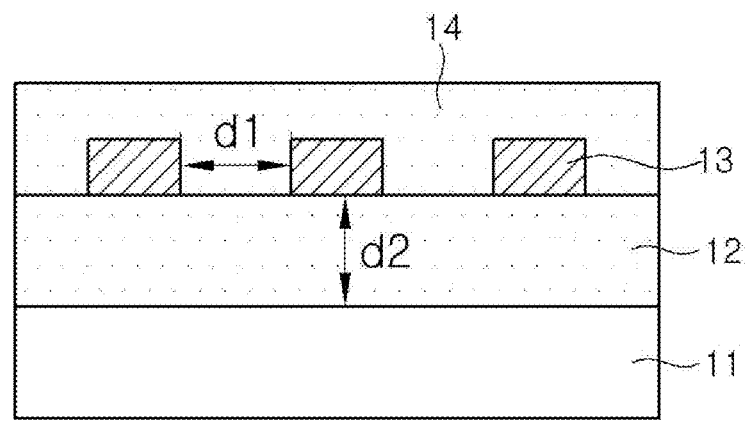
FIG. 2 is a lateral cross-sectional view illustrating a structure of an inductor.
Figure 9:
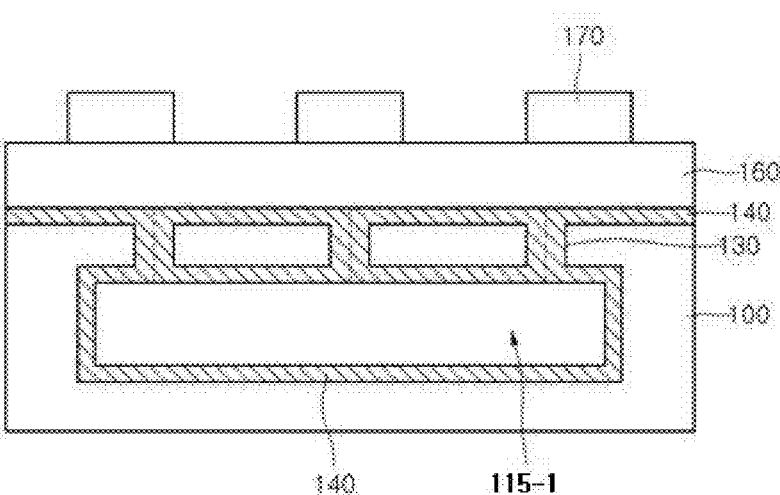

Referring now to FIG. 9, the inductor may comprise or be embodied as a metal wiring 170, and the metal wiring 170 may have or be formed in a spiral shape. For instance, in a plan view (e.g., like FIG. 1), the metal wiring 170 may have or be formed in a wound spring or coil shape. More particularly, the metal wiring 170 may be fabricated into an elongated profile without cutting or become a wind-up type spiral spring. Alternatively, the metal wiring 170 may have a serpentine shape or a spiral form while having several bent parts (e.g., a combination of spiral and serpentine shapes).

Figure 3:
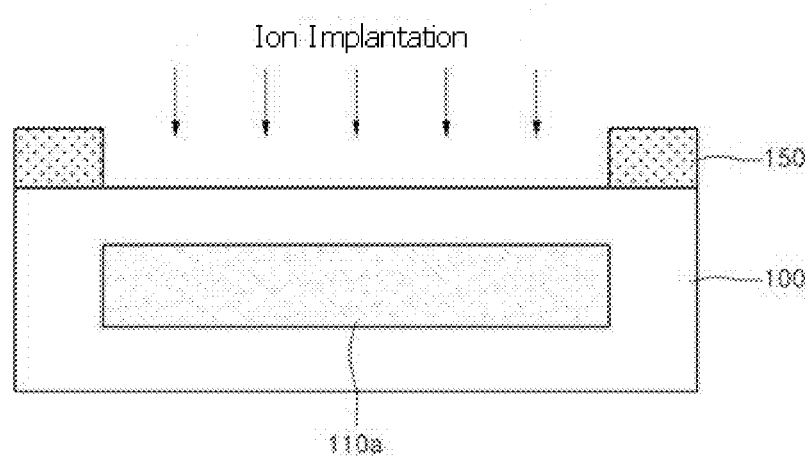
FIGS. 3 to 9 are cross-sectional views illustrating a semiconductor device according to one or more exemplary embodiments of the present invention.

Referring to FIG. 3, a photoresist pattern 150 is formed on a selected part of a silicon substrate 100, on which an inductor is to be placed, exposing the selected part. Using the photoresist pattern 150 as a mask, oxygen ions are implanted into the silicon substrate 100 at a predetermined depth or depth range below the exposed surface of the substrate to form an ion implantation region 110a inside the silicon substrate 100. The predetermined (e.g., target) depth or depth range of the ion implantation region 110a may be from 500 Å to 5000 Å, or any value or range therein.

Figure 4:
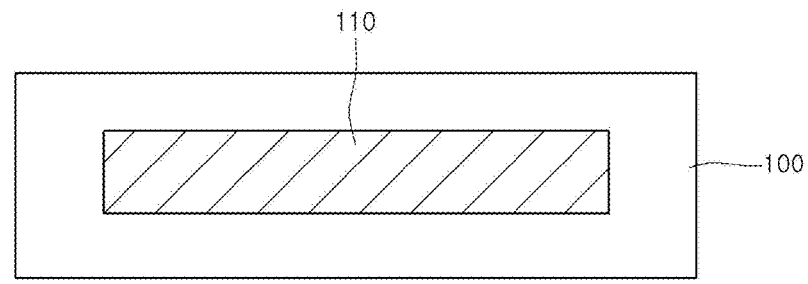

Referring to FIG. 4, the silicon substrate 100 is subjected to heat treatment. The substrate layer 100 may be a layer of polysilicon deposited by Chemical vapor deposition (CVD), an epitaxially grown silicon layer, or a single crystal silicon wafer (e.g., the backside of the wafer, which can support an inductor when the integrate circuitry on the front side is configured for flip-chip bonding and/or when the die include through-vias for making electrical connections between the inductor and the integrated circuitry). As a result, oxygen ions in the ion implantation region 110a are combined with silicon in the silicon substrate 100 to generate a silicon oxide film 110 inside the silicon substrate 100. The heat treatment may comprise rapid thermal annealing or laser heating, for example at a temperature of from 400° C. to 1000° C., or any value or values therein, for a length of time of from, e.g., 1 second to 1 minute (or any value or range of values therein). Such a silicon oxide film 110 serves as a sacrificial film to be further removed. The sacrificial film according to exemplary embodiments is not particularly limited to the oxygen ion implantation region (e.g., it may include carbon, nitrogen and/or hydrogen, etc.), and the silicon oxide film obtained by annealing the ion implantation region is replaceable with various film materials that can be formed by an ion implantation process that implants impurities below the substrate surface and a thermal treatment process that converts the silicon and the implanted impurities to a silicon compound that can be selectively removed. The foregoing silicon oxide film 110 is formed at a position inside the substrate 100, corresponding to a part or area in which the inductor is to be formed.

Figure 5:
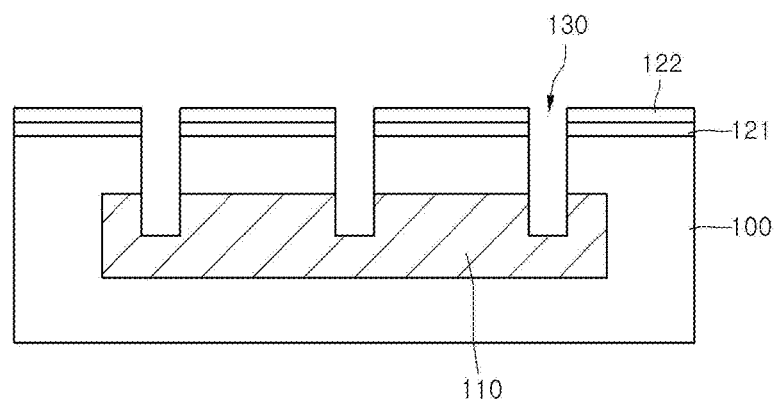

Referring to FIG. 5, a first oxide film 121 is formed on the silicon substrate 100 (e.g., by CVD or thermal oxidation) and a first nitride film 121 is formed on the first oxide film 121 (e.g., by CVD or sputtering). Although not illustrated, a photoresist pattern is formed on the nitride film 122 and is used in patterning the same as well as the first oxide film 121. Using the patterned first oxide film 121 and nitride film 121 as a mask, the silicon substrate 100 is etched to form a plurality of trenches 130. Each of the trenches 130 may have a width of 2,000 to 4,000 Å.

In a plan view, the trenches 130 may be formed in a straight pattern or zig-zag pattern. In addition, the trenches 130 may form a checkered pattern. The trenches 130 may take a variety of forms or have irregular patterns with different shapes. Moreover, trenches with extended length may be formed around the inductor and, in this case, the silicon oxide film may be easily removed.

Each trench 130 reaches the silicon oxide film 110 inside the silicon substrate 100. The silicon oxide film 110 is exposed at a bottom of the trench 130. The trench may be formed to pass into or through the silicon oxide film 110.

Figure 6A:
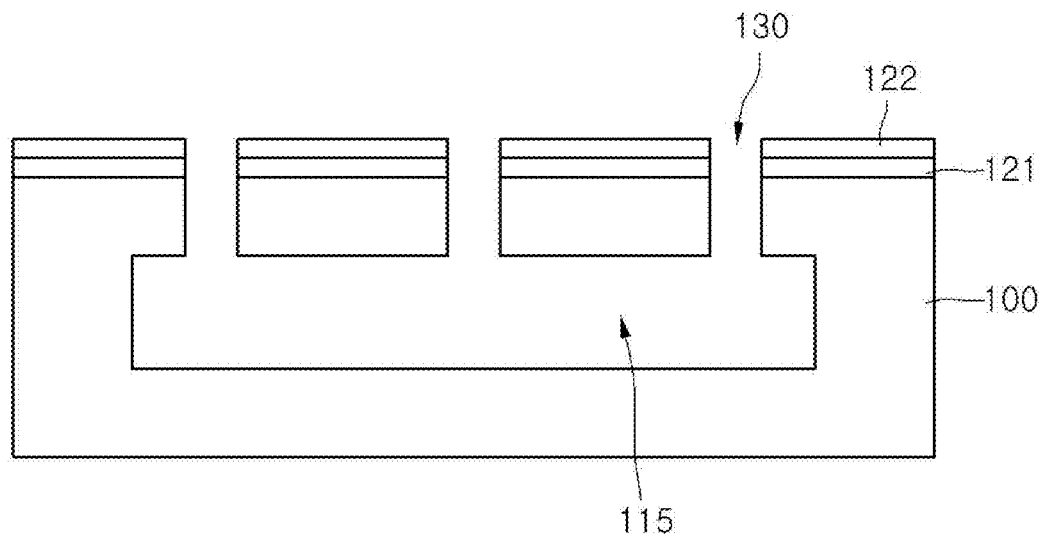
Figure 6B:
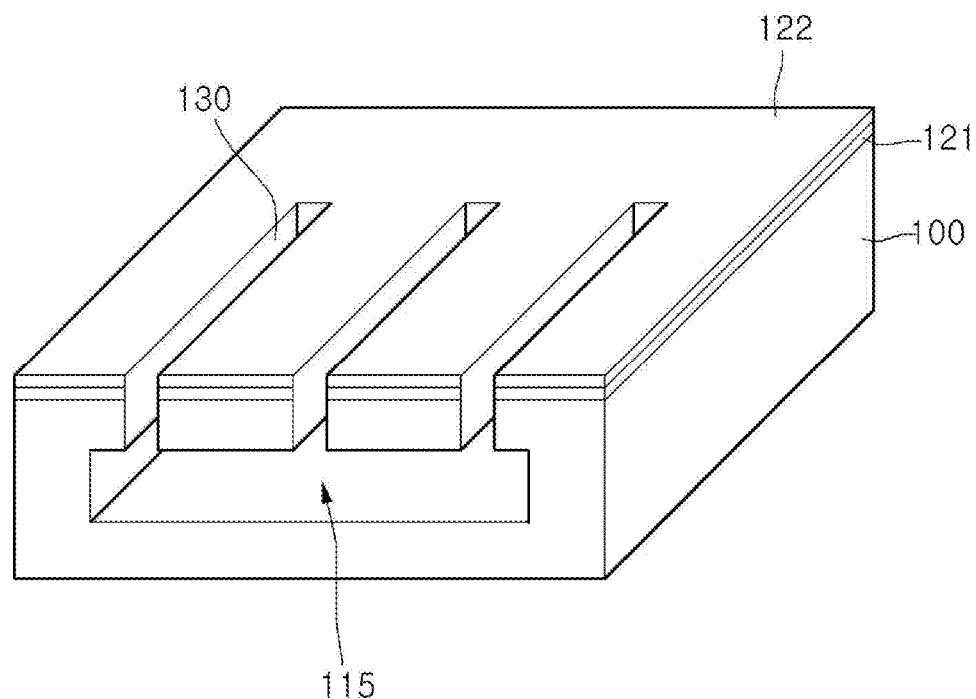

Referring to FIGS. 6A and 6B, a wet etchant (such as aqueous HF, which may be diluted with deionized water and/or buffered with ammonia and/or ammonium fluoride) is poured into the silicon substrate 100 through the trench 130 or sprayed onto the silicon substrate 100 in order to remove the silicon oxide film 110. Alternatively, the substrate 100 with the trenches 130 etched therein may be immersed in a bath of such a wet etchant for a predetermined period of time, generally sufficient to remove the sacrificial (e.g., silicon oxide) layer 110. After wet etching the silicon oxide film 110, the silicon substrate 100 is dried to completely eliminate residual etchant from a space or void 115 generated in the substrate.

After completely removing the silicon oxide film 110, the space or void 115 remains at portions of the silicon substrate 100 from which the silicon oxide film 110 has been removed. Accordingly, the trenches 130 in the silicon substrate 100 communicate with the space or void 115 at the bottom of the trenches 130. Thus, an air layer is formed or generated in the space or void 115. That is, the space or void 115 is connected to the outside through the trench 130. In further embodiments, plural spaces 115 may be formed at constant intervals from one another. Such plural spaces may be formed in adjacent die in a wafer, or in the same die.

Afterward, both the first oxide film 121 and the nitride film 122 on the silicon substrate 100 are removed. The first oxide film 121 may be removed during removal of the silicon oxide film conducted beforehand. The nitride film 122 present on the first oxide film 121 may also be eliminated by a lift-off process when the first oxide film 121 is removed. Alternatively, both the first oxide film 121 and the nitride film 122 may be eliminated immediately after the oxygen ion implantation process.

Figure 7:
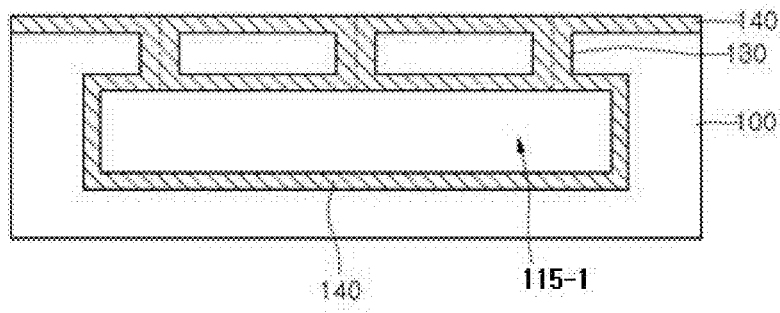

Referring to FIG. 7, the silicon substrate 100, which has the space or void 115 inside the silicon substrate 100 and the trenches 130 in the silicon substrate 100 to communicate with the space or void 115, is subjected to oxidation in order to form a second oxide film 140 on exposed surfaces of the silicon substrate 100. In particular, the second oxide film 140 may be formed on an uppermost surface of the silicon substrate 100, lateral walls of the trench 130, and/or along an inner wall of the space or void 115. After sufficient thermal oxidation, the second oxide film 140 grown on the lateral walls of the trench 130 comes together due to a narrow width of the trench 130, thus effectively closing the trench 130.

As a result, the trench 130 is filled by a thermal oxide, and further thermal oxidation is not conducted within the space or void 115, thus generating an air layer 115-1. Owing to the second oxide film 140 in the trench 130, the space or void 115 forms an air layer 115-1 shielded or isolated from outside.

Figure 8:
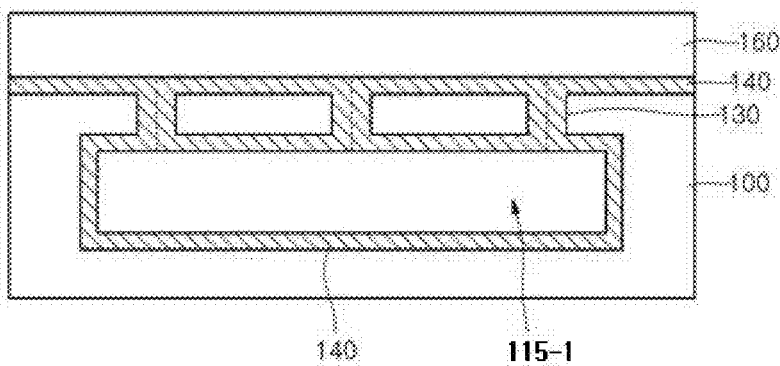

Referring to FIG. 8, a dielectric film 160 (e.g., an interlayer dielectric film) is formed on or above the second oxide film 140 on the silicon substrate 100. Such a dielectric film 160 may comprise an oxide film (e.g., silicon dioxide) and be formed by CVD, using TEOS or silane as a silicon source and dioxygen and/or ozone as an oxygen source.

Referring to FIG. 9, a metal wiring 170, that is, an inductor line or pattern, is formed above the dielectric film 160. The metal wiring 170 may have a spiral form comprising a plurality of concentric loops (e.g., at least 3, 5, 10, 20 or more such loops). For example, in a plan view, a top of the metal wiring 170 may have a wind-up spring or coil shape. In particular, the metal wiring 170 may be fabricated into an elongated profile without cutting (e.g., having a serpentine shape) or become a wind-up type spiral spring.

As is apparent from the above disclosure, a semiconductor device fabricated according to exemplary embodiments of the present invention has an inductor on a substrate 100 having an air layer 115-1 therein, so as to reduce parasitic capacitance between the inductor and the substrate. In addition, because of the reduced parasitic capacitance, the inductor may have an improved self-resonance frequency and an increased applicable frequency band.

Moreover, since the reduction of the parasitic capacitance improves inductor performance at a specific frequency band, an inductor with a high Q factor may be formed or embodied, and the quality or qualities of an inductor at a specific frequency band may be favorably enhanced.

Although exemplary embodiments of the present invention have been described, it will be apparent to those skilled in the art that the present invention is not limited to the exemplary embodiments and accompanying drawings described above but may cover substitutions, variations and/or modifications thereof without departing from the scope of the invention defined in the appended claims.

What is claimed is:

1. A method for fabricating a semiconductor device, comprising:
    forming an ion implantation region in a substrate;
    heating the substrate to change the ion implantation region into a sacrificial layer;
    forming a plurality of trenches in the substrate to expose the sacrificial layer;
    removing the sacrificial layer through or exposed by the trenches to generate a space or void inside the substrate;
    oxidizing the substrate to form an oxide film along an inner wall of the internal space; and
    forming a metal wiring on an uppermost surface of the substrate having the oxide film thereon.

2. The method according to claim 1, wherein the formation of the ion implantation region comprises selectively implanting oxygen ions into the substrate such that the ion implantation region is a predetermined distance below a surface of the substrate.

3. The method according to claim 2, wherein a plurality of ion implantation regions are formed at a constant interval from each other.

4. The method according to claim 2, wherein the sacrificial layer comprises a silicon oxide film.

5. The method according to claim 1, wherein oxidizing the substrate further forms the oxide film on an uppermost surface of the substrate as well as a lateral wall of each trench.

6. The method according to claim 1, wherein oxidizing the substrate effectively closes the trenches by growing the oxide film along sidewalls thereof, thereby forming the air layer or void in the substrate.

7. The method according to claim 1, wherein the oxide film is formed by thermal oxidation.

8. The method according to claim 1, wherein removing the sacrificial layer comprises wet etching.

9. The method according to claim 8, further comprising drying the substrate after removing the sacrificial layer.

10. The method according to claim 1, further comprising drying the substrate after removing the sacrificial layer.

11. The method according to claim 1, wherein forming the plurality of trenches comprises:
    forming a hard mask on the substrate; and
    etching the substrate using the hard mask as an etching mask to expose the sacrificial layer, so as to form the trenches.

12. The semiconductor device according to claim 1, wherein the metal wiring forms an inductor.

13. The method according to claim 1, wherein the metal wiring forms an inductor line.

* * * * *